(12) United States Patent
Morikawa et al.

(10) Patent No.: US 8,198,386 B2
(45) Date of Patent: Jun. 12, 2012

(54) FLUORINE-CONTAINING ELASTOMER COMPOSITION AND SEALING MATERIAL MADE OF SAME

(75) Inventors: Tatsuya Morikawa, Settsu (JP); Hirokazu Komori, Settsu (JP); Meiten Koh, Settsu (JP)

(73) Assignee: Daikin Industries, Ltd., Osaka (JP)

( * ) Notice: Subject to any disclaimer, the term of this patent is extended or adjusted under 35 U.S.C. 154(b) by 249 days.

(21) Appl. No.: 12/594,892

(22) PCT Filed: Apr. 9, 2008

(86) PCT No.: PCT/JP2008/056981
§ 371 (c)(1),
(2), (4) Date: Oct. 6, 2009

(87) PCT Pub. No.: WO2008/133004
PCT Pub. Date: Nov. 6, 2008

(65) Prior Publication Data
US 2010/0120988 A1    May 13, 2010

(30) Foreign Application Priority Data
Apr. 16, 2007 (JP) ................. 2007-107391

(51) Int. Cl.
*C08F 16/24* (2006.01)
*C08F 214/18* (2006.01)
*C08F 214/26* (2006.01)

(52) U.S. Cl. ......... 526/247; 526/250; 526/251; 526/217

(58) Field of Classification Search ............... 525/326.3; 526/247, 251, 250, 217
See application file for complete search history.

(56) References Cited

U.S. PATENT DOCUMENTS

| | | | |
|---|---|---|---|
| 4,525,539 A * | 6/1985 | Feiring | 525/326.3 |
| 5,677,389 A | 10/1997 | Logothetis et al. | |
| 5,789,489 A * | 8/1998 | Coughlin et al. | 525/370 |
| 6,114,452 A * | 9/2000 | Schmiegel | 525/194 |
| 6,992,143 B2 * | 1/2006 | Wang | 525/326.3 |
| 2001/0044500 A1 | 11/2001 | Saito | |
| 2001/0047048 A1 | 11/2001 | Saito | |
| 2003/0125463 A1 | 7/2003 | Tatsu et al. | |
| 2003/0191247 A1 | 10/2003 | Kawasaki et al. | |

FOREIGN PATENT DOCUMENTS

| | | |
|---|---|---|
| EP | 0 110 420 A1 | 6/1984 |
| EP | 0 735 095 A1 | 10/1996 |
| EP | 1 197 517 A1 | 4/2002 |
| JP | 10-292056 A | 11/1998 |
| JP | 2000-290454 A | 10/2000 |
| JP | 2001-504855 A | 4/2001 |
| JP | 2002-003677 A | 1/2002 |
| JP | 2002-012705 A | 1/2002 |
| WO | 98/23675 A1 | 6/1998 |

* cited by examiner

*Primary Examiner* — Ling Choi
(74) *Attorney, Agent, or Firm* — Sughrue Mion, PLLC

(57) ABSTRACT

A fluorine-containing elastomer composition assuring a low compression set and comprising a perfluoroelastomer (A) comprising (a) 18 to 33% by mole of a perfluoro(alkyl vinyl ether) unit, (b) 0.3 to 0.6% by mole of a monomer unit having at least one selected from the group consisting of a nitrile group, a carboxyl group and an alkoxycarbonyl group and (c) a tetrafluoroethylene unit.

5 Claims, No Drawings

FLUORINE-CONTAINING ELASTOMER COMPOSITION AND SEALING MATERIAL MADE OF SAME

TECHNICAL FIELD

The present invention relates to a fluorine-containing elastomer composition and a sealing material made of the composition.

BACKGROUND ART

Fluorine-containing elastomers, particularly perfluoroelastomers mainly comprising a tetrafluoroethylene (TFE) unit are widely used as sealing materials, etc. to be used under harsh environment because of excellent chemical resistance, solvent resistance and heat resistance thereof.

However with advance in technologies, more rigorous demand for characteristics has been imposed, and in the fields of aviation and space industries, semiconductor manufacturing equipment and chemical plant, sealing property under high temperature environment of not less than 300° C. is demanded.

To cope with such a demand, attempts to improve heat resistance by using a specific crosslinking system have been proposed. One example is a disclosure of a curable composition comprising a fluorine-containing elastomer having a nitrile group introduced as a cure site and being subjected to crosslinking with a curing agent and an organic or inorganic ammonium salt (for example, refer to JP2001-504885A). The curable composition of JP2001-504885A has an effect of giving excellent thermal stability and chemical resistance when cured, but it is necessary to improve compression set of a cured article obtained by curing the curable composition.

DISCLOSURE OF INVENTION

It is an object of the present invention to provide a sealing material having small compression set and a fluorine-containing elastomer composition providing the sealing material.

The present invention relates to a fluorine-containing elastomer composition comprising a perfluoroelastomer (A) comprising (a) 18 to 33% by mole of a perfluoro(alkyl vinyl ether) unit, (b) 0.3 to 0.6% by mole of a monomer unit having at least one selected from the group consisting of a nitrile group, a carboxyl group and an alkoxycarbonyl group and (c) a tetrafluoroethylene unit.

The monomer unit (b) is preferably a nitrile group-containing monomer unit.

The perfluoro(alkyl vinyl ether) unit (a) is preferably a perfluoro(methyl vinyl ether) unit.

It is preferable that the fluorine-containing elastomer composition further comprises a crosslinking agent (B) being crosslinkable with at least one selected from the group consisting of a nitrile group, a carboxyl group and an alkoxycarbonyl group of the monomer unit (b).

An amount of the crosslinking agent (B) is preferably 0.3 to 10.0 parts by mass based on 100 parts by mass of the perfluoroelastomer (A).

The crosslinking agent (B) is preferably a compound having at least two crosslinkable reaction groups represented by the formula (1):

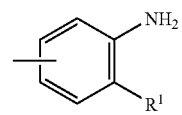

in which $R^1$s are the same or different and each is —$NH_2$, —$NHR^2$, —OH or —SH; $R^2$ is a monovalent organic group, a compound represented by the formula (2):

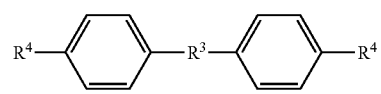

in which $R^3$ is —$SO_2$—, —O—, —CO—, an alkylene group having 1 to 6 carbon atoms, a perfluoroalkylene group having 1 to 10 carbon atoms or a single bond; $R^4$ is

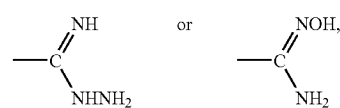

a compound represented by the formula (3):

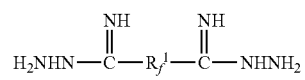

in which $R_f^1$ is a perfluoroalkylene group having 1 to 10 carbon atoms, or a compound represented by the formula (4):

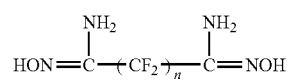

in which n is an integer of 1 to 10.

The present invention also relates to a sealing material for semiconductor manufacturing equipment made of the above-mentioned fluorine-containing elastomer composition.

BEST MODE FOR CARRYING OUT THE INVENTION

The present invention relates to the fluorine-containing elastomer composition comprising the perfluoroelastomer (A) comprising (a) 18 to 33% by mole of a perfluoro(alkyl vinyl ether) unit (hereinafter also referred to as PAVE), (b) 0.3 to 0.6% by mole of a monomer unit having at least one selected from the group consisting of a nitrile group, a carboxyl group and an alkoxycarbonyl group and a tetrafluoroethylene unit.

The content of PAVE unit (a) in the perfluoroelastomer (A) is not less than 18% by mole, preferably not less than 20% by mole, more preferably not less than 23% by mole, from the viewpoint that the elastomer does not have properties akin to those of a resin and properties of an elastic rubber are not lost. Also the content of PAVE unit in the perfluoroelastomer (A) is not more than 33% by mole, preferably not more than 31% by mole, more preferably not more than 29% by mole, from the viewpoint of satisfactory compression set at high temperatures.

In this case, examples of PAVE are, for instance, perfluoro (methyl vinyl ether) (hereinafter referred to as PMVE), perfluoro(propyl vinyl ether) and the like. These can be used alone or can be used in optional combination thereof to such an extent not to impair the effect of the present invention.

Among these, PMVE is preferred from the viewpoint of excellent mechanical strength of a cured article.

From the viewpoint of increasing crosslinking density and enhancing sealing property of the sealing material, the content of monomer unit (b) having at least one selected from the group consisting of a nitrile group, a carboxyl group and an alkoxycarbonyl group is not less than 0.3% by mole, preferably not less than 0.4% by mole in the perfluoroelastomer (A). The content of monomer unit (b) in the perfluoroelastomer (A) is not more than 0.6% by mole, preferably not more than 0.5% by mole from the viewpoint of inhibiting lowering of elongation due to increase in crosslinking density.

Examples of the monomer unit (b) are, for instance, monomers represented by the formula (5):

$$CF_2=CFO(CF_2CF(CF_3)O)_m(CF_2)_n-X^1 \quad (5)$$

wherein m is 0 or an integer of 1 to 5, n is an integer of 1 to 3, $X^1$ is a nitrile group, a carboxyl group or an alkoxycarbonyl group. These can be used alone or can be used in optional combination thereof.

The nitrile group, carboxyl group or alkoxycarbonyl group can function as a cure site. In addition, from the viewpoint of excellent crosslinkability, the monomer unit (b) is preferably a nitrile group-containing monomer in which a cure site is a nitrile group.

Examples of the monomer unit (b) are monomers represented by the formulae (6) to (22):

$$CY_2=CY(CF_2)_n-X^2 \quad (6)$$

where Y is hydrogen atom or fluorine atom, n is an integer of 1 to 8, $$CF_2=CFCF_2R_f^2-X^2 \quad (7)$$

where $R_f^2$ is $-(OCF_2)_n-$ or $-(OCF_2)_n-$, n is 0 or an integer of 1 to 5, $$CF_2=CFCF_2(OCF(CF_3)CF_2)_m(OCH_2CF_2CF_2)_nOCH_2CF_2-X^2 \quad (8)$$

where m is 0 or an integer of 1 to 5, n is 0 or an integer of 1 to 5, $$CF_2=CFCF_2(OCH_2CF_2CF_2)_m(OCF(CF_3)CF_2)_nOCF(CF_3)-X^2 \quad (9)$$

where m is 0 or an integer of 1 to 5, n is 0 or an integer of 1 to 5, $$CF_2=CF(OCF_2CF(CF_3))_mO(CF_2)_n-X^2 \quad (10)$$

where m is 0 or an integer of 1 to 5, n is an integer of 1 to 8, $$CF_2=CF(OCF_2CF(CF_3))_m-X^2 \quad (11)$$

where m is an integer of 1 to 5, $$CF_2=CFOCF_2(CF(CF_3)OCF_2)_nCF(-X^2)CF_3 \quad (12)$$

where n is an integer of 1 to 4, $$CF_2=CFO(CF_2)_nOCF(CF_3)-X^2 \quad (13)$$

where n is an integer of 2 to 5, $$CF_2=CFO(CF_2)_n-(C_6H_4)-X^2 \quad (14)$$

where n is an integer of 1 to 6, $$CF_2=CF(OCF_2CF(CF_3))_nOCF_2CF(CF_3)-X^2 \quad (15)$$

where n is an integer of 1 to 2, $$CH_2=CFCF_2O(CF(CF_3)CF_2O)_nCF(CF_3)-X^2 \quad (16)$$

where n is 0 or an integer of 1 to 5, $$CF_2=CFO(CF_2CF(CF_3)O)_m(CF_2)_n-X^2 \quad (17)$$

where m is 0 or an integer of 1 to 5, n is an integer of 1 to 3, $$CH_2=CFCF_2OCF(CF_3)OCF(CF_3)-X^2 \quad (18)$$

$$CH_2=CFCF_2OCH_2CF_2-X^2 \quad (19)$$

$$CF_2=CFO(CF_2CF(CF_3)O)_mCF_2CF(CF_3)-X^2 \quad (20)$$

where m is an integer of not less than 0, $$CF_2=CFOCF(CF_3)CF_2O(CF_2)_n-X^2 \quad (21)$$

where n is an integer of not less than 1, $$CF_2=CFOCF_2OCF_2CF(CF_3)OCF_2-X^2 \quad (22),$$

and in the formulae (6) to (22), $X^2$ is a nitrile group (—CN group), a carboxyl group (—COOH group) or an alkoxycarbonyl group (—COOR$^5$ group, where R$^5$ is an alkyl group which has 1 to 10 carbon atoms and may have fluorine atom). Among these, perfluoro compounds having no hydrogen atom are preferred from the viewpoint of excellent heat resistance of the perfluoroelastomer (A) and for inhibiting decrease of a molecular weight due to chain transfer when synthesizing the perfluoroelastomer by polymerization reaction. In addition, a compound having a $CF_2=CFO-$ structure is preferred from the viewpoint of excellent polymerization reactivity with tetrafluoroethylene.

Examples of such perfluoroelastomer (A) are those disclosed in JP9-512569A, WO 00/29479, JP11-92529A, etc. Those perfluoroelastomers (A) can be prepared by known methods.

Those perfluoroelastomers (A) can be prepared by a polymerization method such as emulsion polymerization method, suspension polymerization method and solution polymerization method, and from the viewpoint of easy handling, emulsion polymerization method is suitable.

The radical polymerization initiator used in the present invention may be those which have been used for polymerization of fluorine-containing rubbers, and examples thereof are organic and inorganic peroxides and azo compounds. Represented initiators are persulfates, percarbonates, peresters and the like, and a preferred initiator is ammonium persulfate (APS). APS may be used alone or can be used in combination with reducing agents such as sulfites and sulfites.

The emulsifier used for emulsion polymerization can be selected from a wide range, and from the viewpoint of inhibiting chain transfer to the emulsifier molecules which occurs during the polymerization, salts of carboxylic acid having a fluorocarbon chain or a fluoropolyether chain are desirable. The amount of the emulsifier is preferably from about 0.05% by mass to about 2% by mass, particularly preferably 0.2 to 1.5% by mass based on the added water.

The monomer mixture gas used in the present invention is explosive as described in Advances in Chemistry Series, G. H. Kalb, et al., 129, 13 (1973), and therefore, it is necessary to take any measures for polymerization equipment not to cause sparking which becomes an ignition source.

The polymerization pressure can be changed in a wide range, and generally is within a range from 0.5 to 7 MPa. The higher the polymerization pressure is, the more a polymerization rate is increased. Accordingly from the viewpoint of enhancement of productivity, the polymerization pressure is preferably not less than 0.7 MPa.

For introducing at least one selected from the group consisting of a nitrile group, a carboxyl group and an alkoxycarbonyl group to the fluorine-containing elastomer used in the present invention, as mentioned above, there is a method of adding and copolymerizing a monomer having a cure site when preparing the fluorine-containing elastomer. Example of another method is a method of subjecting a polymerization product to acid treatment to convert a group such as a metallic salt or ammonium salt of a carboxylic acid contained in the polymerization product to carboxyl group. Example of a suitable acid treatment method is a method of washing with hydrochloric acid, sulfuric acid or nitric acid or a method of decreasing a pH value of a mixture system after the polymerization reaction to 3 or less by using the mentioned acid.

In addition, it is possible to introduce carboxyl group by oxidizing a crosslinkable elastomer containing iodine or bromine with a fuming nitric acid or a fuming sulfuric acid.

It is preferable that the fluorine-containing elastomer composition of the present invention comprises the crosslinking agent (B) crosslinkable with the above-mentioned group of the fluorine-containing elastomer being capable of acting as a cure site.

The crosslinking agent (B) used in the present invention is at least one crosslinking agent selected from the group consisting of an oxazole crosslinking agent, an imidazole crosslinking agent, a thiazole crosslinking agent, a triazine crosslinking agent, an amidoxime crosslinking agent and an amidrazone crosslinking agent. An oxazole crosslinking agent, an imidazole crosslinking agent and a thiazole crosslinking agent are crosslinking agents reacting with a nitrile group, a carboxyl group or an alkoxycarbonyl group of the fluorine-containing elastomer to form an oxazole ring, a thiazole ring and an imidazole ring, respectively, thus providing a crosslinked article. A triazine crosslinking agent is a crosslinking agent reacting with a nitrile group of the fluorine-containing elastomer to form a triazine ring, thus providing a crosslinked article. The triazine crosslinking agent encompasses compounds such as organotin compounds explained infra which can be a catalyst enabling a triazine ring to be formed with only a nitrile group of the fluorine-containing elastomer. An amidoxime crosslinking agent and an amidrazone crosslinking agent are crosslinking agents having an amidoxime structure and an amidrazone structure, respectively and reacting with a nitrile group of the fluorine-containing elastomer. Among these, an imidazole crosslinking agent is preferred in that a crosslinked article having excellent mechanical strength, heat resistance and chemical resistance, particularly a crosslinked article being excellent in heat resistance and chemical resistance in good balance can be provided.

From the viewpoint of heat resistance, preferred example of an oxazole crosslinking agent, an imidazole crosslinking agent, a thiazole crosslinking agent, a triazine crosslinking agent, an amidoxime crosslinking agent and an amidrazone crosslinking agent is at least one compound selected from the group consisting of a compound having at least two crosslinkable reaction groups represented by the formula (1):

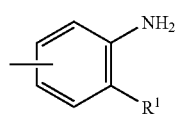

in which $R^1$s are the same or different and each is $-NH_2$, $-NHR^2$, $-OH$ or $-SH$; $R^2$ is a monovalent organic group, a compound represented by the formula (2):

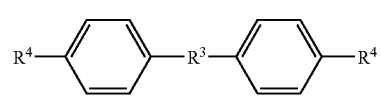

in which $R^3$ is $-SO_2-$, $-O-$, $-CO-$, an alkylene group having 1 to 6 carbon atoms, a perfluoroalkylene group having 1 to 10 carbon atoms or a single bond; $R^4$ is

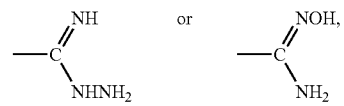

a compound represented by the formula (3):

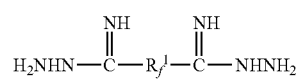

in which $R_f^1$ is a perfluoroalkylene group having 1 to 10 carbon atoms, and a compound represented by the formula (4):

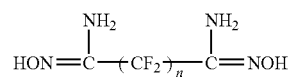

in which n is an integer of 1 to 10.

Among these compounds, the compound having at least two crosslinkable reaction groups represented by the formula (1) is preferred in that heat resistance is enhanced due to structural stabilization by aromatic rings after the crosslinking.

The compound having at least two crosslinkable reaction groups represented by the formula (1) is preferably one having 2 or 3 crosslinkable reaction groups, more preferably one having 2 crosslinkable reaction groups. When the number of crosslinkable reaction groups represented by the formula (1) is less than 2, crosslinking cannot be achieved.

$R^2$ contained in the substituent $R^1$ of the crosslinkable reaction group represented by the formula (1) is a monovalent organic group other than hydrogen atom. Since a $N-R^2$ bond is higher in oxidation resistance than a $N-H$ bond, it is preferable to use $-NHR^2$ as the substituent $R^1$.

The monovalent organic group is not limited particularly, and examples thereof are an aliphatic hydrocarbon group, a phenyl group and a benzyl group. Specifically, for example, at least one of $R^2$ is a lower alkyl group having 1 to 10, particularly 1 to 6 carbon atoms such as $-CH_3$, $-C_2H_5$ or $-C_3H_7$; a fluorine atom-containing lower alkyl group having 1 to 10, particularly 1 to 6 carbon groups such as $-CF_3$, $-C_2F_5$, $-CH_2F$, $-CH_2CF_3$ or $-CH_2C_2F_5$; a phenyl group; a benzyl group; a phenyl group or a benzyl group, in which 1 to 5 hydrogen atoms are substituted by fluorine atoms such as $-C_6F_5$ or $-CH_2C_6F_5$; or a phenyl group or a benzyl group, in which 1 to 5 hydrogen atoms are substituted by $-CF_3$ such as $-C_6H_{5-n}(CF_3)_n$ or $-CH_2C_6H_{5-n}(CF_3)_n$ where n is an integer of 1 to 5.

Among these, a phenyl group and —CH₃ are preferred from the viewpoint of especially excellent heat resistance, satisfactory crosslinkability and relatively easy synthesis.

From the viewpoint of easy synthesis, preferred as the crosslinking agent (B) are compounds which have two crosslinkable reaction groups represented by the formula (1) and are represented by the formula (23):

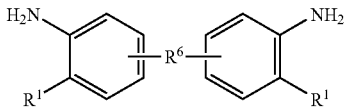

wherein $R^1$ is as defined above, $R^6$ is —SO₂—, —O—, —CO—, an alkylene group having 1 to 6 carbon atoms, a perfluoroalkylene group having 1 to 10 carbon atoms, a single bond or a group represented by:

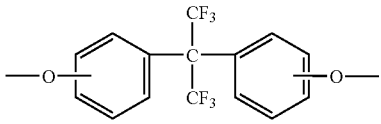

Preferable examples of alkylene groups having 1 to 6 carbon atoms are methylene, ethylene, propylene, butylene, pentylene, hexylene and the like. Examples of perfluoroalkylene groups having 1 to 10 carbon atoms are

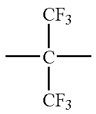

and the like. These compounds are known as examples of bisdiaminophenyl compound in JP2-59177B, JP8-120146A, etc.

Among these compounds, more preferred compounds as the crosslinking agent (B) are compounds represented by the formula (24):

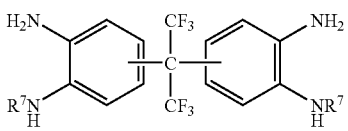

wherein $R^7$s are the same or different and each is hydrogen atom, an alkyl group having 1 to 10 carbon atoms; an alkyl group having 1 to 10 carbon atoms and containing fluorine atom; a phenyl group; a benzyl group; or a phenyl group or benzyl group, in which 1 to 5 hydrogen atoms are replaced by fluorine atoms and/or —CF₃.

Non-limiting examples thereof are, for instance, 2,2-bis(3,4-diaminophenyl)hexafluoropropane, 2,2-bis[3-amino-4-(N-methylamino)phenyl]hexafluoropropane, 2,2-bis[3-amino-4-(N-ethylamino)phenyl]hexafluoropropane, 2,2-bis[3-amino-4-(N-propylamino)phenyl]hexafluoropropane, 2,2-bis[3-amino-4-(N-phenylamino)phenyl]hexafluoropropane, 2,2-bis[3-amino-4-(N-perfluorophenylamino)phenyl]hexafluoropropane, 2,2-bis[3-amino-4-(N-benzylamino) phenyl]hexafluoropropane, and the like. Among these, from the viewpoint of excellent heat resistance, 2,2-bis[3-amino-4-(N-methylamino)phenyl]hexafluoropropane, 2,2-bis[3-amino-4-(N-ethylamino)phenyl]hexafluoropropane, 2,2-bis [3-amino-4-(N-propylamino)phenyl]hexafluoropropane and 2,2-bis[3-amino-4-(N-phenylamino)phenyl]hexafluoropropane are preferred, and from the viewpoint of particularly excellent heat resistance, 2,2-bis[3-amino-4-(N-phenylamino)phenyl]hexafluoropropane is preferred.

These bisamidoxime crosslinking agent, bisamidrazone crosslinking agent, bisaminophenol crosslinking agent, bisaminothiophenol crosslinking agent and bisdiaminophenyl crosslinking agent react with a nitrile group, a carboxyl group or an alkoxycarbonyl group of the fluorine-containing elastomer and forms an oxazole ring, a thiazole ring, an imidazole ring or a triazine ring to provide a crosslinked article.

An amount of the crosslinking agent (B) is preferably not less than 0.3 part by mass, more preferably not less than 0.5 part by mass, further preferably not less than 0.7 part by mass based on 100 parts by mass of the elastomer, from the viewpoint of enhancing crosslinkability of the composition. The amount of the crosslinking agent (B) is preferably not more than 10.0 parts by mass, more preferably not more than 2.0 parts by mass, further preferably not more than 1.5 parts by mass based on 100 parts by mass of the elastomer.

In the present invention, in addition to the above-mentioned crosslinking agents, other crosslinking agent can be used together.

When the fluorine-containing elastomer contains a nitrile group, the fluorine-containing elastomer composition of the present invention may comprise an organotin compound such as tetraphenyltin, triphenyltin or the like because the nitrile group forms a triazine ring, thus making it possible to achieve triazine crosslinking.

In the present invention, an amount of organotin compound is preferably 0.05 to 10 parts by mass, more preferably 1 to 5 parts by mass based on 100 parts by mass of the fluorine-containing elastomer. When the amount of organotin compound is less than 0.05 part by mass, there is a tendency that the fluorine-containing elastomer is not sufficiently crosslinked, and when the amount of organotin compound exceeds 10 parts by mass, physical properties of a crosslinked article tend to be lowered.

In the fluorine-containing elastomer composition of the present invention, usual additives added, as case demands, to crosslinkable elastomer compositions, for example, a filler, a processing aid, a plasticizer and a colorant may be blended thereto. In addition, one or more usual crosslinking agents or crosslinking accelerators different from the above-mentioned ones may be blended to the composition. Also, a different kind of elastomer may be mixed to an extent not to impair the effects of the present invention.

Examples of a filler are organic fillers, and from the viewpoint of heat resistance and plasma resistance (reduced number of particles and low weight reduction rate at emission of plasma), organic pigments; imide fillers having an imide structure such as polyimide, polyamide imide and polyetherimide; ketone type engineering plastics such as polyether ether ketone (PEEK) and polyether ketone (PEK), and organic pigments are particularly preferred.

Examples of organic pigments are condensed azo pigments, isoindolenone pigments, quinacridone pigments, diketopyrrolopyrrole pigments, anthraquinone pigments, and the like. Among these pigments, from the viewpoint of excellent heat resistance and chemical resistance and less effect on characteristics of a molded article, quinacridone pigments, diketopyrrolopyrrole pigments and anthraquinone pigments are preferred, and quinacridone pigments are more preferred.

Further, the fluorine-containing crosslinkable composition of the present invention may contain a general filler.

Examples of general fillers are organic fillers made of engineering plastics such as polyarylate, polysulfone, polyether sulfone, polyphenylene sulfide, polyoxybenzoate and polytetrafluoroethylene powder; metallic oxide fillers such as aluminum oxide, silicon oxide, yttrium oxide and titanium oxide; metallic carbides such as silicon carbide and aluminum carbide, metallic nitride fillers such as silicon nitride and aluminum nitride; and inorganic fillers such as aluminum fluoride, carbon fluoride, barium sulfate, carbon black, silica, clay and talc.

Among these fillers, from the viewpoint of an effect of shielding against various plasmas, aluminum oxide, yttrium oxide, silicon oxide, polyimide and carbon fluoride are preferred.

Also, the above-mentioned inorganic fillers and organic fillers may be used alone or may be blended in combination of two or more thereof.

The composition of the present invention can be prepared by mixing each of the above-mentioned components by using usual processing equipment for rubbers, for example, an open roll, Banbury mixer, kneader, or the like. In addition, the composition can be prepared also by a method of using a closed mixer and a method of co-coagulation through emulsion mixing.

A hardness in Shore A of the crosslinked article obtained by crosslinking the fluorine-containing elastomer of the present invention is preferably not less than 50, more preferably not less than 55, further preferably not less than 60 in that sealing property of the sealing material made of the elastomer composition of the present invention is satisfactory. In addition, hardness of the crosslinked article is preferably not more than 95, more preferably not more than 90, further preferably not more than 85 in that sealing property of the sealing material made of the elastomer composition of the present invention is satisfactory.

The crosslinked article obtained by crosslinking and molding the fluorine-containing elastomer composition of the present invention is excellent in chemical resistance, mechanical strength and heat resistance, and therefore, is suitable as a sealing material for sealing of semiconductor equipment. Examples of the sealing material are O-ring, square ring, gasket, packing, oil seal, bearing seal, lip seal, etc.

In the present invention, the semiconductor manufacturing equipment is not limited particularly to equipment for producing semiconductors and encompasses the whole manufacturing equipment used in the field of semiconductors where a high degree of cleanliness is required, such as equipment for manufacturing a liquid crystal panel and a plasma panel. Examples of the semiconductor manufacturing equipment are as follows.

(1) Etching system
   Dry etching equipment
      Plasma etching machine
      Reactive ion etching machine
      Reactive ion beam etching machine
      Sputter etching machine
      Ion beam etching machine
   Wet etching equipment
   Ashing equipment
(2) Cleaning system
   Dry etching cleaning equipment
      $UV/O_3$ cleaning machine
      Ion beam cleaning machine
      Laser beam cleaning machine
      Plasma cleaning machine
      Gas etching cleaning machine
   Extractive cleaning equipment
      Soxhlet extractive cleaning machine
      High temperature high pressure extractive cleaning machine
      Microwave extractive cleaning machine
      Supercritical extractive cleaning machine
(3) Exposing system
   Stepper
   Coater and developer
(4) Polishing system
   CMP equipment
(5) Film forming system
   CVD equipment
   Sputtering equipment
(6) Diffusion and ion implantation system
   Oxidation and diffusion equipment
   Ion implantation equipment

EXAMPLES

The present invention is then explained by means of examples, but is not limited to them.

Preparation Example 1

(Synthesis of Perfluoroelastomer A)

Into a 3-liter stainless steel autoclave having no ignition source were poured 1 liter of pure water, 23.4 g of:

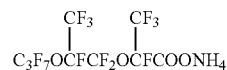

as an emulsifying agent and 0.21 g of $(NH_4)_2CO_3$, and the inside of a system was sufficiently replaced with nitrogen gas and subjected to deaeration. Then, the autoclave was heated up to 52° C. with stirring at 600 rpm, and a gas mixture of tetrafluoroethylene (TFE) and perfluoro(methyl vinyl ether) (PMVE) (molar ratio of TFE/PMVE=41/59) was introduced to give the inside pressure of 0.78 MPa·G. Then, after introducing 0.89 g of $CF_2$=$CFO(CF_2)_5CN$ with pressurized nitrogen gas, a solution prepared by dissolving 12.3 g of ammonium persulfate (APS) in 30 g of water was introduced with pressurized nitrogen gas to initiate a reaction.

As the polymerization proceeded, since the inside pressure of a reactor decreased, pressurized TFE and PMVE were introduced to increase the inside pressure to 0.78 MPa·G. Until completion of the polymerization, 20 g of TFE and 12.2 g of PMVE were introduced at self-pressure thereof. Thereafter, pressurized TFE and PMVE were introduced in the same manner as above, and increase and decrease of the inside pressure were repeated within a range from 0.73 MPa·G to 0.83 MPa·G. Thus, 400 g of TFE and 244 g of PMVE were introduced. During the polymerization, $CF_2$=$CFO(CF_2)_5CN$ was introduced 17 times, amounting to 15.15 g in total. Then, the autoclave was cooled and unreacted monomer was released to obtain 3,009 g of an aqueous dispersion having a solid content of 22.8% by mass. The polymerization time was 5.3 hours.

1,000 g of the obtained aqueous dispersion was distilled with 1,000 g of water, and the distilled solution was slowly added to 2,800 g of an aqueous solution of 3.5% by mass of hydrochloric acid with stirring. After completion of the addition, the solution was stirred for five minutes, and then a coagulated product was filtered off. The obtained polymer was poured into 2 kg of 1,1-dichloro-1-fluoroethane (HCFC-141b), followed by 5-minute stirring and filtering off again. Thereafter, washing with HCFC-141b and filtering off were repeated further four times, followed by vacuum drying at 60° C. for 72 hours to obtain 220 g of a polymer (Perfluoroelastomer A).

As a result of $^{19}$F-NMR analysis, this polymer was one comprising monomer units of TFE/PMVE/CF$_2$=CFO(CF$_2$)$_5$CN in a molar percent of 73.69/25.9/0.41.

Preparation Examples 2 to 7

(Synthesis of Perfluoroelastomers B to G)

Polymerization was carried out in the same manner as in Preparation Example 1 except that an amount of initial charge and an additional amount were changed as shown in Table 1.

This fluorine-containing elastomer composition was subjected to press crosslinking at 180° C. for ten minutes and then two-stage crosslinking in an oven at 204° C. for 18 hours and then at 288° C. for 18 hours to prepare a 2 mm thick test sample of a crosslinked article. Compression set of this crosslinked article was measured by the following method. The results are shown in Table 2.

(Compression Set)

A compression set of an O-ring (AS-568A-214) after left at 310° C. for 72 hours is measured in accordance with JIS K6301.

Example 2

A test sample was prepared in the same manner as in Example 1 except that the Perfluoroelastomer B prepared in Preparation Example 2 was used instead of the Perfluoroelastomer A prepared in Preparation Example 1, and physical property was measured in the same manner as in Example 1. The results are shown in Table 2.

TABLE 1

| Prep. Ex. | Perfluoroelastomer | Amount of initial charge | | Additional amount of TFE and PMVE during polymerization (first addition) | |
|---|---|---|---|---|---|
| | | TFE/PMVE (molar ratio) | CF$_2$=CFO(CF$_2$)$_5$CN (g) | TFE (g) | PMVE (g) |
| 2 | B | 35/65 | 0.866 | 20.0 | 14.2 |
| 3 | C | 35/65 | 0.901 | 20.0 | 14.2 |
| 4 | D | 22/78 | 0.850 | 16.2 | 17.8 |
| 5 | E | 22/78 | 0.800 | 16.2 | 17.8 |
| 6 | F | 28/72 | 0.840 | 18.1 | 16.2 |
| 7 | G | 22/78 | 0.815 | 16.2 | 17.8 |

| Prep. Ex. | Additional amount of TFE and PMVE during polymerization (second addition) | | | Solid content (% by mass) | Aqueous dispersion (g) | Polymerization reaction time (hr) | Polymer (g) |
|---|---|---|---|---|---|---|---|
| | TFE (g) | PMVE (g) | CF$_2$=CFO(CF$_2$)$_5$CN (g) | | | | |
| 2 | 400 | 284 | 14.72 | 22.5 | 3,087 | 5.3 | 219 |
| 3 | 400 | 284 | 15.32 | 22.3 | 2,991 | 6.14 | 215 |
| 4 | 325 | 356 | 14.45 | 20.6 | 2,978 | 8.07 | 201 |
| 5 | 325 | 356 | 13.6 | 20.9 | 2,925 | 8.12 | 203 |
| 6 | 363 | 324 | 14.28 | 22.6 | 2,990 | 6.00 | 220 |
| 7 | 325 | 356 | 13.86 | 21.1 | 2,989 | 8.70 | 208 |

Example 1

The Perfluoroelastomer A prepared in Preparation Example 1 and a compound (N-Ph) represented by the formula:

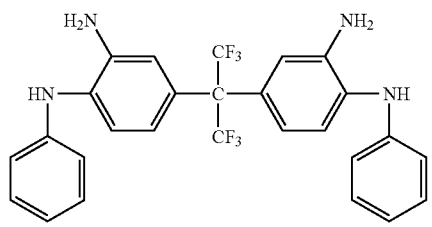

were mixed in a mass ratio of 100/1, and kneaded with an open roll to prepare a crosslinkable fluorine-containing elastomer composition.

Example 3

A test sample was prepared in the same manner as in Example 1 except that the Perfluoroelastomer C prepared in Preparation Example 3 was used instead of the Perfluoroelastomer A prepared in Preparation Example 1, and physical property was measured in the same manner as in Example 1. The results are shown in Table 2.

Comparative Example 1

A test sample was prepared in the same manner as in Example 1 except that the Perfluoroelastomer D prepared in Preparation Example 4 was used instead of the Perfluoroelastomer A prepared in Preparation Example 1 and the Perfluoroelastomer D and N-Ph were mixed in amounts shown in Table 2, and physical property was measured in the same manner as in Example 1. The results are shown in Table 2.

Comparative Examples 2 to 6

Test samples were prepared in the same manner as in Example 1 except that the Perfluoroelastomer E prepared in Preparation Example 5 was used instead of the Perfluoroelastomer A prepared in Preparation Example 1 and the Perfluoroelastomer E and N-Ph were mixed in amounts shown in Table 2, and physical property was measured in the same manner as in Example 1. The results are shown in Table 2.

Comparative Example 7

A test sample was prepared in the same manner as in Example 1 except that the Perfluoroelastomer F prepared in Preparation Example 6 was used instead of the Perfluoroelastomer A prepared in Preparation Example 1 and the Perfluoroelastomer F and N-Ph were mixed in amounts shown in Table 2, and physical property was measured in the same manner as in Example 1. The results are shown in Table 2.

Comparative Example 8

A test sample was prepared in the same manner as in Example 1 except that the Perfluoroelastomer G prepared in Preparation Example 7 was used instead of the Perfluoroelastomer A prepared in Preparation Example 1 and the Perfluoroelastomer G and N-Ph were mixed in amounts shown in Table 2, and physical property was measured in the same manner as in Example 1. The results are shown in Table 2.

Preparation Example 8

(Synthesis of Perfluoroelastomer H)

Into a 82-liter stainless steel autoclave having no ignition source were poured 31.95 liter of pure water, 319.8 g of:

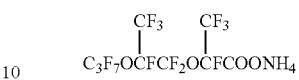

as an emulsifying agent and 2.87 g of $(NH_4)_2CO_3$, and the inside of a system was sufficiently replaced with nitrogen gas and subjected to deaeration. Then, the autoclave was heated up to 52° C. with stirring at 245 rpm, and a gas mixture of tetrafluoroethylene (TFE) and perfluoro(methyl vinyl ether) (PMVE) (molar ratio of TFE/PMVE=35/65) was introduced to give the inside pressure of 0.78 MPa·G. Then, after introducing 12.30 g of $CF_2=CFOCF_2CF(CF_3)OCF_2CF_2CN$ (CNVE) with pressurized nitrogen gas, a solution prepared by dissolving 168.1 g of ammonium persulfate (APS) in 410 g of water was introduced with pressurized nitrogen gas to initiate a reaction.

As the polymerization proceeded, the inside pressure of a reactor decreased, and when the inside pressure decreased to 0.73 MPa·G, the first additional charging of 190 g of TFE and 138 g of PMVE was carried out to increase the inside pressure. Thereafter, as the reaction proceeded, pressurized TFE and PMVE were introduced in the same manner as above in a molar ratio of TFE/PMVE=70/30, and increase and decrease

TABLE 2

| | Example | | | Comparative Example | | |
|---|---|---|---|---|---|---|
| | 1 | 2 | 3 | 1 | 2 | 3 |
| Amount | | | | | | |
| Perfluoroelastomer | A | B | C | D | E | E |
| Perfluoroelastomer (part by mass) | 100 | 100 | 100 | 100 | 100 | 100 |
| Components of perfluoroelastomer | | | | | | |
| TFE (mole %) | 73.69 | 69.37 | 69.15 | 58.5 | 58.22 | 58.22 |
| PMVE (mole %) | 25.9 | 30.2 | 30.4 | 41 | 41.4 | 41.4 |
| $CF_2=CFO(CF_2)_5CN$ (mole %) | 0.41 | 0.43 | — | — | — | — |
| CNVE (mole %) | — | — | 0.45 | 0.5 | 0.38 | 0.38 |
| N-Ph (part by mass) | 1 | 1 | 1 | 0.8 | 0.6 | 0.8 |
| Evaluation | | | | | | |
| Compression set 310° C. × 72 hours (%) | 16.3 | 18.3 | 18.5 | 28.0 | 38.2 | 31.0 |

| | Comparative Example | | | | |
|---|---|---|---|---|---|
| | 4 | 5 | 6 | 7 | 8 |
| Amount | | | | | |
| Perfluoroelastomer | E | E | E | F | G |
| Perfluoroelastomer (part by mass) | 100 | 100 | 100 | 100 | 100 |
| Components of perfluoroelastomer | | | | | |
| TFE (mole %) | 58.22 | 58.22 | 58.22 | 63.56 | 57.87 |
| PMVE (mole %) | 41.4 | 41.4 | 41.4 | 36 | 41.7 |
| $CF_2=CFO(CF_2)_5CN$ (mole %) | — | — | — | 0.44 | 0.43 |
| CNVE (mole %) | 0.38 | 0.38 | 0.38 | — | — |
| N-Ph (part by mass) | 1 | 1.2 | 1.4 | 1 | 1 |
| Evaluation | | | | | |
| Compression set 310° C. × 72 hours (%) | 28.3 | 27.4 | 28.1 | 24.7 | 30.7 | of the inside pressure were repeated within a range from 0.73 MPa·G to 0.83 MPa·G. Thus, the total amounts of TFE and PMVE were 5,469 g and 3,883 g, respectively, inclusive of the amounts of the first initial charge. During the polymerization, CNVE was introduced 17 times, amounting to 209.1 g in total. Then, the autoclave was cooled and unreacted monomer was released to obtain 43,686 g of an aqueous dispersion having a solid content of 22.12% by mass. The polymerization time was 5.78 hours.

1,000 g of the obtained aqueous dispersion was distilled with 1,000 g of water, and the distilled solution was slowly added to 2,800 g of an aqueous solution of 3.5% by mass of hydrochloric acid with stirring. After completion of the addition, the solution was stirred for five minutes, and then a coagulated product was filtered off. The obtained polymer, i.e. the coagulated product was poured into 3,000 g of pure water, followed by 5-minute washing with stirring and then filtering off. Washing of the obtained polymer with pure water was repeated in the same manner as above, and when a pH value of the washing water used became 6 or more, the polymer was taken out and subjected to vacuum drying at 70° C. for 72 hours to obtain 205 g of a polymer (Perfluoroelastomer H).

As a result of $^{19}$F-NMR analysis, this polymer was one comprising monomer units of TFE/PMVE/CNVE in a molar percent of 69.06/30.5/0.44.

Preparation Examples 9 to 14

(Synthesis of Perfluoroelastomers I to N)

Polymerization was carried out in the same manner as in Preparation Example 8 except that CNVE was changed to $CF_2=CFO(CF_2)_5CN$ and an amount of initial charge and an additional amount were changed as shown in Table 3.

Examples 4 to 8

Crosslinkable fluorine-containing elastomer compositions were prepared by kneading the perfluoroelastomers H to L prepared in Preparation Examples 8 to 12, respectively, a compound (N-Ph) represented by the formula:

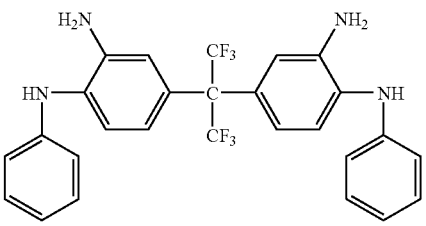

and carbon (Thermax N990 available from Cancarb Co., Ltd.) in a mass ratio of 100/1/20 with an open roll.

These fluorine-containing elastomer compositions were subjected to press crosslinking at 180° C. for two hours and then crosslinking in an oven at 290° C. for 18 hours to prepare O-rings of P-24 standard (JIS B 2401). Compression set of these O-rings was measured by the following method. The results are shown in Table 4.

(Compression Set)

A compression set of an O-ring after left under 25% compression at 310° C. for 72 hours is measured in accordance with JIS K6301.

Comparative Examples 9 and 10

Fluorine-containing elastomer compositions and test samples were prepared in the same manner as in Examples 4 to 8 except that the Perfluoroelastomers M and N prepared in Preparation Examples 13 and 14, respectively were used, and physical property was measured. The results are shown in Table 4.

TABLE 3

| Prep. Ex. | Perfluoroelastomer | Amount of initial charge TFE/PMVE (molar ratio) | Amount of initial charge $CF_2=CFO(CF_2)_5CN$ (g) | Additional amount of TFE and PMVE at inside pressure of 0.73 MPa · G (first addition) TFE (g) | Additional amount of TFE and PMVE at inside pressure of 0.73 MPa · G (first addition) PMVE (g) | Ratio of initial charge TFE/PMVE |
|---|---|---|---|---|---|---|
| 9 | I | 35/65 | 11.8 | 190 | 138 | 70/30 |
| 10 | J | 41/59 | 11.8 | 211 | 117 | 75/25 |
| 11 | K | 48/52 | 11.8 | 232 | 96 | 80/20 |
| 12 | L | 35/65 | 10.0 | 190 | 138 | 70/30 |
| 13 | M | 22/78 | 11.8 | 156 | 172 | 60/40 |
| 14 | N | 28/72 | 11.8 | 173 | 155 | 65/35 |

| Prep. Ex. | Total amount charged TFE (g) | Total amount charged PMVE (g) | Additional charge $CF_2=CFO(CF_2)_5CN$ (g) | Solid content (% by mass) | Aqueous dispersion (g) | Polymerization reaction time (hr) | Polymer (g) |
|---|---|---|---|---|---|---|---|
| 9 | 5,469 | 3,883 | 200.5 | 22.01 | 43,150 | 5.57 | 208 |
| 10 | 6,021 | 3,331 | 200.5 | 22.23 | 42,990 | 5.27 | 212 |
| 11 | 6,609 | 2,743 | 200.5 | 21.05 | 43,550 | 5.22 | 203 |
| 12 | 5,469 | 3,883 | 170.4 | 21.67 | 43,200 | 5.40 | 210 |
| 13 | 4,439 | 4,931 | 200.5 | 21.88 | 43,300 | 6.13 | 218 |
| 14 | 4,938 | 4,414 | 200.5 | 22.01 | 43,000 | 8.65 | 215 |

TABLE 4

| | Example | | | | | Com. Ex. | |
|---|---|---|---|---|---|---|---|
| | 4 | 5 | 6 | 7 | 8 | 9 | 10 |
| Amount | | | | | | | |
| Perfluoroelastomer | H | I | J | K | L | M | N |
| Perfluoroelastomer (part by mass) | 100 | 100 | 100 | 100 | 100 | 100 | 100 |
| Components of perfluoroelastomer | | | | | | | |
| TFE (mole %) | 69.06 | 68.79 | 73.88 | 77.62 | 69.38 | 58.39 | 63.67 |
| PMVE (mole %) | 30.5 | 30.8 | 25.7 | 21.9 | 30.3 | 41.2 | 35.9 |
| $CF_2{=}CFO(CF_2)_5CN$ (mole %) | — | 0.41 | 0.42 | 0.48 | 0.32 | 0.41 | 0.43 |
| CNVE (mole %) | 0.44 | — | — | — | — | — | — |
| N-Ph (part by mass) | 1 | 1 | 1 | 1 | 1 | 1 | 1 |
| Carbon (part by mass) | 20 | 20 | 20 | 20 | 20 | 20 | 20 |
| Evaluation | | | | | | | |
| Compression set 310° C. × 72 hours (%) | 21.0 | 20.8 | 19.0 | 20.2 | 21.5 | 30.2 | 26.3 |

INDUSTRIAL APPLICABILITY

According to the present invention, a novel elastomer composition for crosslinking providing a crosslinked rubber molded article having small compression set can be provided.

The invention claimed is:

1. A fluorine-containing elastomer composition comprising a perfluoroelastomer (A) comprising
   (a) 18 to 33% by mole of a perfluoro(alkyl vinyl ether) unit,
   (b) 0.3 to 0.6% by mole of a monomer unit having at least one selected from the group consisting of a nitrile group, a carboxyl group and an alkoxycarbonyl group and
   (c) a tetrafluoroethylene unit; and
   a crosslinking agent (B) of the formula (24)

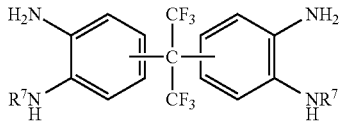

(24)

wherein the groups $R^7$ are the same or different and each is optionally fluorinated $C_{1-10}$-alkyl; or phenyl or benzyl each optionally substituted by 1-5 groups independently selected from F and —$CF_3$.

2. The fluorine-containing elastomer composition of claim 1, wherein the monomer unit (b) is a nitrile group-containing monomer unit.

3. The fluorine-containing elastomer composition of claim 1, wherein the perfluoro(alkyl vinyl ether) unit (a) is a perfluoro(methyl vinyl ether) unit.

4. The fluorine-containing elastomer composition of claim 1, wherein an amount of the crosslinking agent (B) is 0.3 to 10.0 parts by mass based on 100 parts by mass of the perfluoroelastomer (A).

5. A sealing material for semiconductor manufacturing equipment made of the fluorine-containing elastomer composition of claim 1.

* * * * *